(12) United States Patent
Kobayashi et al.

(10) Patent No.: US 9,808,841 B2
(45) Date of Patent: Nov. 7, 2017

(54) RETICLE CHUCK CLEANER AND RETICLE CHUCK CLEANING METHOD

(75) Inventors: Yoshihito Kobayashi, Tokyo (JP); Masamitsu Itoh, Tokyo (JP); Taro Inada, Shibukawa (JP); Jun Watanabe, Tokyo (JP)

(73) Assignee: Toshiba Memory Corporation, Tokyo (JP)

(*) Notice: Subject to any disclaimer, the term of this patent is extended or adjusted under 35 U.S.C. 154(b) by 689 days.

(21) Appl. No.: 14/342,718

(22) PCT Filed: Jun. 22, 2012

(86) PCT No.: PCT/JP2012/066041
§ 371 (c)(1),
(2), (4) Date: May 30, 2014

(87) PCT Pub. No.: WO2013/035415
PCT Pub. Date: Mar. 14, 2013

(65) Prior Publication Data
US 2014/0326278 A1 Nov. 6, 2014

(30) Foreign Application Priority Data
Sep. 5, 2011 (JP) .................................. 2011-192595

(51) Int. Cl.
*B08B 7/00* (2006.01)
*G03F 7/20* (2006.01)

(52) U.S. Cl.
CPC .......... *B08B 7/0028* (2013.01); *B08B 7/0014* (2013.01); *G03F 7/707* (2013.01); *G03F 7/70925* (2013.01)

(58) Field of Classification Search
CPC .... B08B 7/0028; G03F 7/707; G03F 7/70925
See application file for complete search history.

(56) References Cited

U.S. PATENT DOCUMENTS 3,189,480 A * 6/1965 Lehmann ................ C08F 24/00
428/355 AC
2003/0139019 A1* 7/2003 Kudo ................ H01L 21/67132
438/460

(Continued)

FOREIGN PATENT DOCUMENTS

JP  2003-142370  5/2003
JP  2003-209034  7/2003

(Continued)

OTHER PUBLICATIONS

First Office Action issued by the State Intellectual Property Office of the People's Republic of China dated Oct. 19, 2015, for Chinese Patent Application No. 201280043092.0, and English-language translation thereof.

(Continued)

*Primary Examiner* — Xiao Zhao
(74) *Attorney, Agent, or Firm* — Finnegan, Henderson, Farabow, Garrett & Dunner, L.L.P.

(57) ABSTRACT

There is provided a reticle chuck cleaner A for cleaning a reticle chuck of an apparatus, as a reticle chuck cleaner that allows easy cleaning of a reticle chuck in a vacuum chamber of an apparatus without exposing the chamber to the atmosphere and contributes to improvement of the operating ratio of the apparatus, including: an adhesive layer 1 to be adhered to a chuck region of the reticle chuck; a support layer 2 laminated on the adhesive layer 1; and a substrate 3 having a shape capable of being carried to the reticle chuck, the support layer 2 and the substrate 3 being partially bonded together in an adhesive region 41 of a partial adhesive layer 4.

12 Claims, 9 Drawing Sheets

(56) References Cited

U.S. PATENT DOCUMENTS

2012/0009394 A1* 1/2012 Cheng ................ B32B 37/1292
428/194
2012/0024318 A1* 2/2012 Itoh ...................... B08B 7/0028
134/6

FOREIGN PATENT DOCUMENTS

| | | |
|---|---|---|
| JP | 2006-229122 | 8/2006 |
| JP | 2007-165699 | 6/2007 |
| JP | 2008-226973 | 9/2008 |
| JP | 2009-146959 | 7/2009 |
| JP | 2011-044490 | 3/2011 |

OTHER PUBLICATIONS

Notification on Submission of Opinion issued by the Korean Intellectual Property Office dated May 22, 2015, for Korean Patent Application No. 10-2014-7005424, and English-language translation thereof.
English-language International Search Report from Japanese Patent Office for International Appilcation No. PCT/JP2012/066041, dated Aug. 14, 2012.

* cited by examiner (B)

(A)

(B)

(B)

(C)

(B)

(A)

(B)

(B)

(A)

(B)

(B)

(C)

RETICLE CHUCK CLEANER AND RETICLE CHUCK CLEANING METHOD

TECHNICAL FIELD

The present invention relates to reticle chuck cleaners and reticle chuck cleaning methods. More specifically, the present invention relates to reticle chuck cleaners or the like for cleaning a reticle chuck in an apparatus.

BACKGROUND ART

In recent years, there has been used EUV lithography with miniaturization of semiconductors. EUV light is as short in wavelength as 13.5 nm and thus is immediately attenuated in the atmosphere. Therefore, wafer exposure apparatuses (EUV scanners) using EUV light need to have an exposure optical system set up in vacuum. In this case, a reticle stage is placed in vacuum, and thus the chuck mechanism of an EUV mask cannot use a vacuum chuck system but employs an electrostatic chuck system. The electrostatic chuck system requires a chuck region of a larger area as compared to the vacuum chuck system, to obtain a specific retaining force. Accordingly, it is necessary to use the most part of the back surface of the EUV mask as a chuck region.

In EUV lithography, as described above, since the most part of the back surface of the EUV mask is used as a chuck region, foreign matters make it prone to reside on the front surface of the chuck mechanism. If foreign matters get caught between the chuck mechanism and the EUV mask, the EUV mask is deformed to generate distortion on the patterned surface. This causes a problem that the pattern transferred onto a wafer is distorted. In addition, since the chuck mechanism is located within a vacuum chamber, it is necessary to return the inside of the vacuum chamber to the atmosphere pressure before cleaning the vacuum chamber to remove foreign matters. in this case, the EUV scanner is stopped for a longer time, which is a major factor in decreasing the operating ratio of the EUV scanner.

CITATION LIST

Patent Literatures

[Patent Document 1]
Japanese Unexamined Patent Application Publication No. 2009-146959

SUMMARY OF INVENTION

Technical Problem

A principal object of the present invention is to provide a reticle chuck cleaner that allows easy cleaning of a reticle chuck in a vacuum chamber of an EUV exposure apparatus without exposing the chamber to the atmosphere, and contributes to improvement of the operating ratio of the EUV exposure apparatus.

Solution to Problem

To solve the foregoing problems, the present invention provides a reticle chuck cleaner for cleaning a reticle chuck of an EUV exposure apparatus including: an adhesive layer to be adhered to a chuck region of the reticle chuck; a support layer laminated on the adhesive layer; and a substrate having a shape capable of being carried to the reticle chuck, the support layer and the substrate being partially bonded together. The partial bonding of the support layer and the substrate can be made by a partial adhesive layer having an adhesive region and a non-adhesive region between the support layer and the substrate.

In the reticle chuck cleaner, a bonding part between the support layer and the substrate is provided such that, when the support layer is pulled at the bonding part, a trigger for separating the adhesive layer from the reticle chuck is generated. Accordingly, in the reticle chuck cleaner, the trigger for separation can be generated by the substrate pulling the support layer under its own weight via the bonding part. In addition, the generated trigger for separation acts as a starting point of separation of the adhesive layer from the reticle chuck.

In the reticle chuck cleaner, the partial adhesive layer may be a light-curable adhesive layer. A light-cured region of the light-curable adhesive layer constitutes a non-bonding part between the support layer and the substrate, and the remaining region of the light-curable adhesive layer constitutes the bonding part.

In the reticle chuck cleaner, the non-bonding part between the support layer and the substrate is preferably processed to increase separation property between the support layer and the substrate in contact with each other, or separation property between the partial adhesive layer and the substrate in contact with each other. The process may include formation of asperities on the surface of the substrate or roughening of the surface of the substrate.

The present invention also provides a method for cleaning a reticle chuck of an EUV exposure apparatus, including:

(1) adhesion step of pressing, a reticle chuck cleaner including: an adhesive layer to be adhered to a chuck region of the reticle chuck; a support layer laminated on the adhesive layer; and a substrate having a shape capable of being carried to the reticle chuck, the support layer and the substrate being partially bonded together, against the reticle chuck stored in an evacuated chamber of the EUV exposure apparatus to adhere the adhesive layer to the reticle chuck; and (2) separation step of releasing the reticle chuck from the pressure of the reticle chuck cleaner and pulling the support layer under the weight of the substrate via the bonding part to separate the adhesive layer from the reticle chuck and remove the reticle chuck cleaner from the reticle chuck.

In the reticle chuck cleaning method, at the step (1), the reticle chuck cleaner placed on a reticle carrying means is pressed from below against the reticle chuck and adhered to the reticle chuck. Then, at the step (2), the reticle carrying means is moved downward to release the reticle chuck from the pressure of the reticle chuck cleaner, whereby it is possible to receive the reticle chuck cleaner separated from the reticle chuck under the weight of the substrate, on the reticle carrying means having moved downward.

In the reticle chuck cleaning method, the step (1) may be performed again using the reticle chuck cleaner received on the reticle carrying means at the step (2), or the (1) and (2) steps may be repeatedly performed.

DESCRIPTION OF EMBODIMENTS

Figure 1:
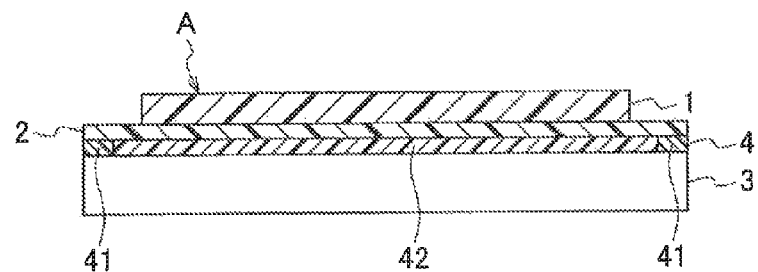
FIG. 1 is a diagram for describing a configuration of a reticle chuck cleaner A according to a first embodiment of the present invention.
Figure 1:
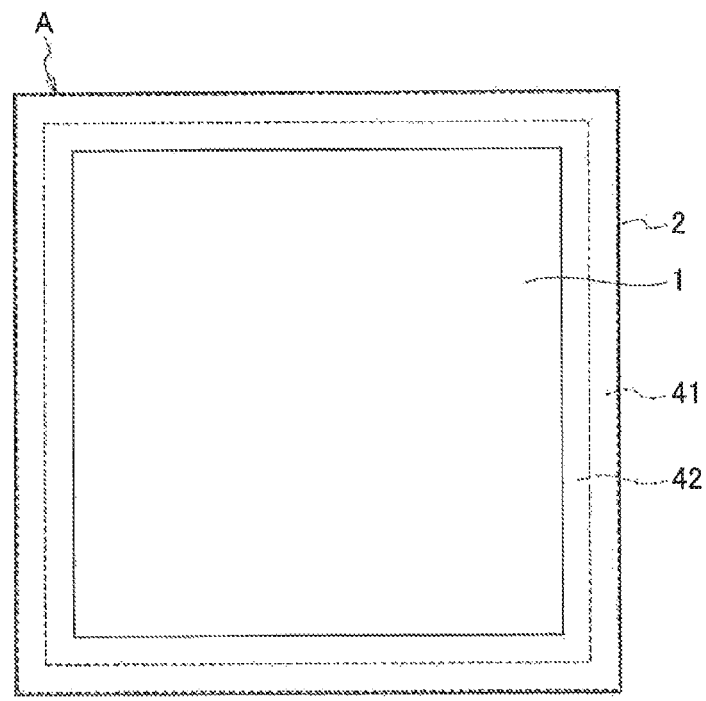

Preferred embodiments for carrying out the present invention will be described below with reference to the drawings. The embodiments described below are mere examples of a typical embodiment of the present invention, and the scope of the present invention is not narrowly construed by the embodiments described below. The descriptions will be given in the following order:
1. Reticle chuck cleaner and reticle chuck cleaning method using the same according to a first embodiment
(1) Reticle chuck cleaner
(2) Reticle chuck cleaning method.
2. Reticle chuck cleaner and reticle chuck cleaning method using the same according to a second embodiment
(1) Reticle chuck cleaner
(2) Reticle chuck cleaning method
1. Reticle chuck cleaner and reticle chuck cleaning method using the same according to a first embodiment
(1) Reticle chuck cleaner FIG. 1 is a schematic view for describing a configuration of a reticle chuck cleaner according to the first embodiment of the present invention. FIG. 1(A) is a cross-sectional view and FIG. 1(B) is an upper view. The reticle chuck cleaner shown with reference code A includes an adhesive layer 1 to be adhered to a chuck region of a reticle chuck in an EUV exposure apparatus, a support layer 2 laminated on the adhesive layer 1, and a substrate 3 having a shape capable of being carried to the reticle chuck.

Reference numeral 4 denotes a partial adhesive layer that allows the support layer 2 and the substrate 3 to bond or adhere to each other in a region with adhesiveness 41 (hereinafter, referred to as "adhesive region 41"). The adhesive region 41 is provided at a circumferential portion of the partial adhesive layer 4, and the central part of the partial adhesive layer 4 (the part other than the adhesive region 41) is referred to as a region without adhesiveness 42 (hereinafter, referred to as "non-adhesive region 42").

[Adhesive Layer]

The adhesive layer 1 can be formed by an adhesive mainly consisting of (meth)acrylic acid ester polymer or an adhesive based on urethane, polyester, epoxy, polyvinyl chloride, melanin, polyimide, silicone, or the like. Although described later in detail, the adhesive may be any of conventionally publicly-known adhesives as far as the adhesive has adhesiveness with which foreign matters on the reticle chuck can be adhered and the reticle chuck cleaner A can be separated from the reticle chuck under its own weight.

As necessary, various kinds of additives such as tackifier, hardner, plasticizer, polymerization inhibitor, and antioxidant may be added to the adhesive.

The lamination of the adhesive layer 1 and the support layer 2 can be made by spin-coating the support layer 2 with a toluene/ethyl acetate solution as an adhesive mainly consisting of acrylic acid ester copolymer and using an isocyanate compound as a cross-linker, for example. In addition, formation of the adhesive layer 1 on the support layer 2 can be performed by any of conventionally publicly-known techniques, such as gravure coaters, comma coaters, bar coaters, knife coaters, roll coaters, letterpress printing, intaglio printing, planography, flexography, offset printing, screen printing, spraying, and the like. Further, the present invention is not limited to the method by which the adhesive is applied directly to the support layer 2 but may use the method by which the adhesive with a desired thickness is applied in advance to a separation film and then is transferred to the support layer 2.

There is no particular limitation on thickness of the dried adhesive layer 1 but the thickness may be 0.5 to 5.0 μm and preferably 1 to 2 μm, for example. The adhesive layer 1 is formed in a size equal to or larger than the chuck region of the reticle chuck in the EUV exposure apparatus.

[Support Layer]

The support layer 2 can be formed by any of conventionally publicly-known resins such as polyvinyl chloride, polyethylene, polypropylene, polyester, ethylene-vinyl alcohol, polyurethane, ionomer, polyamide, polyimide, and PET. These resins may be used as a molten mixture of a plurality of resins or a copolymer of the same. Of the foregoing resins, PET is particularly preferred for its high hardness. The support layer 2 may have a multilayered structure formed by a plurality of resin layers.

[Partial Adhesive Layer]

The partial adhesive layer 4 can be formed by making the adhesive region 41 using the same adhesive as that of the adhesive layer and making the non-adhesive region 42 using the same resin as that of the support layer 2, for example. Alternatively, the partial adhesive layer 4 may be configured such that the adhesive region 41 is made from a general-purpose double-faced tape and the non-adhesive region 42 is made from a PET film or the like.

At the reticle chuck cleaner A, the partial adhesive layer 4 is only needed to allow the support layer 2 and the substrate 3 to partially bond or adhere to each other, and thus the non-adhesive region 42 is not necessarily essential. That is, the partial adhesive layer 4 may have only the adhesive region 41 made by an adhesive or a double-faced tape such that the non-adhesive region 42 is not provided, In this case, a portion of the surface of the support layer 2 facing the substrate 3 and not bonded to the substrate 3 may contact directly the substrate 3.

The partial adhesive layer 4 may be formed using a light-curable adhesive that is hardened by an active light ray such as a radioactive ray or an ultraviolet ray. The light-curable adhesive is applied to the support layer 2 or the substrate 3. Then, of the layer to which the light-curable adhesive is applied using a mask, light is radiated only to a portion corresponding to the non-adhesive region 42 to harden the light-curable adhesive layer. Accordingly, it is possible to form the partial adhesive layer 4 having the adhesive region 41 not radiated by the light to maintain adhesiveness and the non-adhesive region 42 hardened by radiation of light to lose adhesive and bonding properties.
[Substrate]

There is no particular limitation on material for the substrate 3 as far as the substrate 3 has a shape capable of being carried to the reticle chuck in the EUV exposure apparatus. The substrate 3 can be formed using a photo mask blanks material such as glass, quartz, or synthetic quartz.

In the case of using a 6-inch substrate of synthetic quartz (with a thickness of 0.25 inches), for example, the weight of the substrate 3 is about 325 g. This degree of weight of the substrate 3 is sufficient to separate the reticle chuck cleaner A from the reticle chuck under the weight of the substrate 3, as described later. The weight of the substrate 3 can be arbitrarily set as far as the advantage of the present invention can be produced.

In addition to the adhesive layer 1, the support layer 2, the partial adhesive layer 4, and the substrate 3, the reticle chuck cleaner A may have an alignment mark formed on the surface of the substrate 3 opposite to the adhesive layer 1. The alignment mark is used to carry or chuck the reticle chuck cleaner A in the EUV exposure apparatus. The alignment mark can be formed, as in the case of forming a general EUV mask, by applying a resist to an absorber membrane composed mainly of tantalum formed on the substrate 3, etching the absorber membrane with a resist pattern as an etching mask, and removing the resist by cleaning.

(2) Reticle Chuck Cleaning Method

Figure 2:
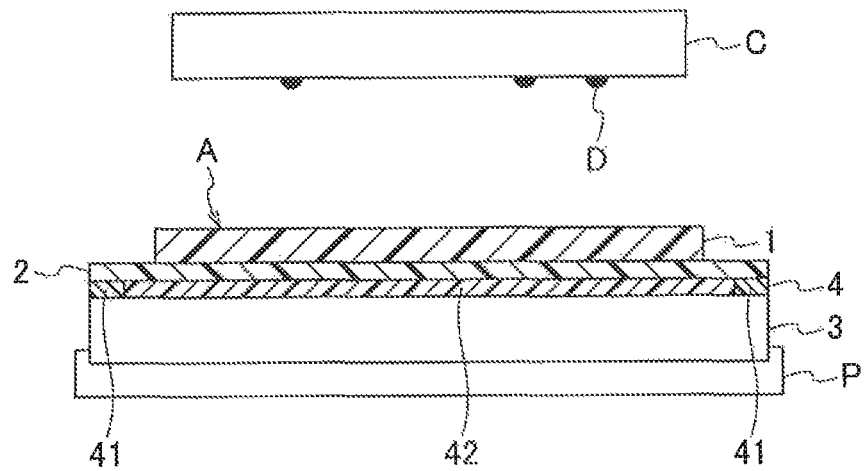
FIG. 2 is a diagram for describing an adhesion step in a reticle chuck cleaning method using the reticle chuck cleaner A.
Figure 2:
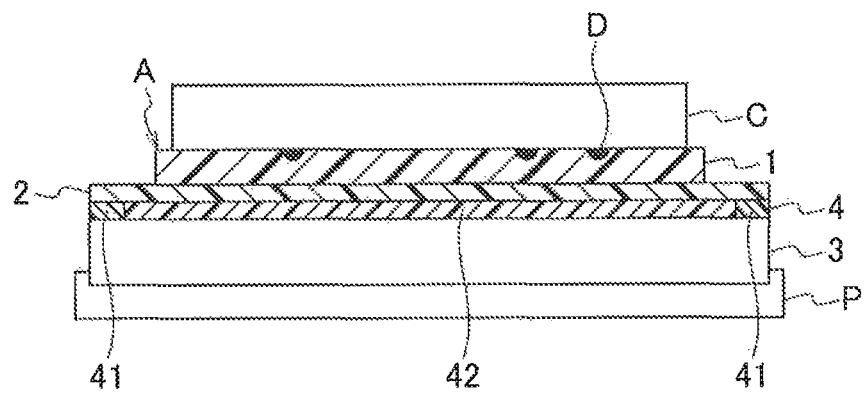
Figure 3:
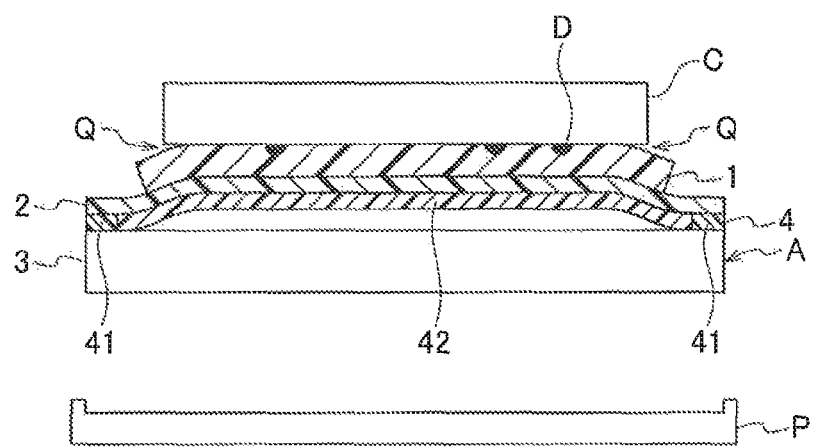
FIG. 3 is a diagram for describing a separation step in the reticle chuck cleaning method using the reticle chuck cleaner A.
Figure 3:
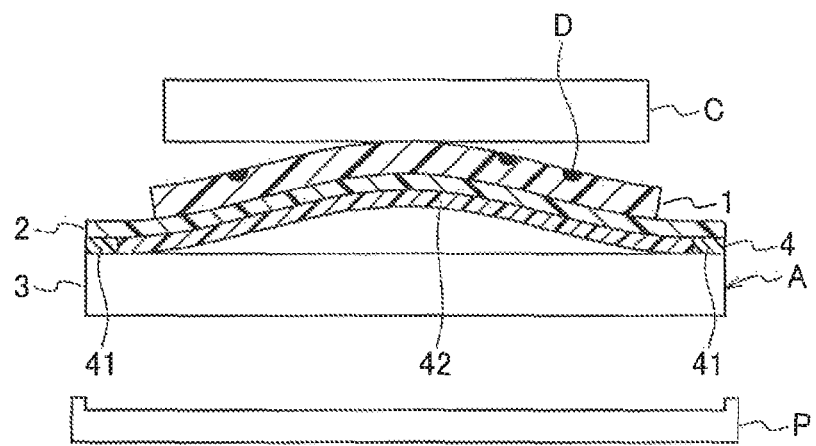
Figure 3:
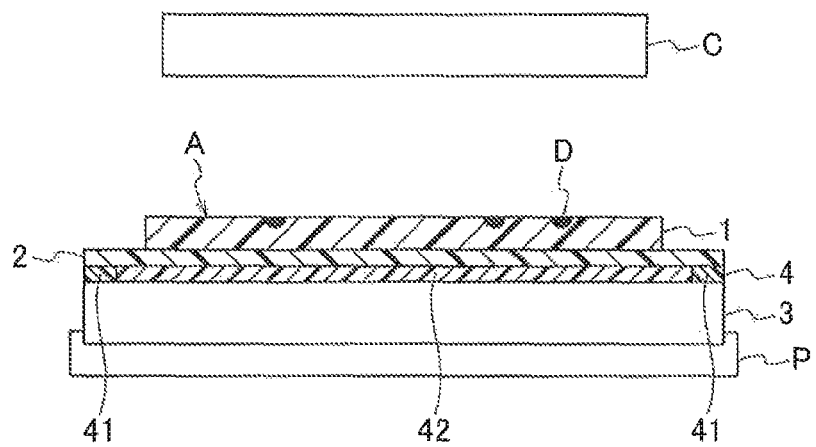

Next, referring to FIGS. 2 and 3, a reticle chuck cleaning method using the reticle chuck cleaner A will be described. FIG. 2 is a schematic cross-sectional view for describing an adhesion step of the reticle chuck cleaning method. FIG. 3 is a schematic cross-sectional view for describing a separation step of the reticle chuck cleaning method.

[Adhesion Step]

At the adhesion step, first, the reticle chuck cleaner A is placed on a reticle port P of the EUV exposure apparatus and carried into the evacuated chamber of the EUV exposure apparatus as in the case of general reticle carrying (refer to FIG. 2(A)).

Next, as in the case of a general reticle chuck, the reticle, port P is brought close to a reticle chuck C and the reticle chuck cleaner A is pressed from below against the reticle chuck C to let the adhesive layer 1 adhere to the reticle chuck C. At that time, foreign matters D on the reticle chuck C attach to the adhesive layer 1 and then dig into the adhesive layer 1 (refer to FIG. 2(B)). The adhesive layer 1 may be adhered to the reticle chuck C by applying a voltage to the reticle chuck C and chucking elecrostatistically the reticle chuck cleaner A to the reticle chuck C on a temporary basis.

[Separation Step]

At the separation step, first, the reticle port P is separated from the reticle chuck C to release the reticle chuck C from the pressure of the reticle chuck cleaner A. Accordingly, the substrate 3 of the reticle chuck cleaner A no longer supported by the reticle port P pulls downward the support layer 2 under its own weight via the adhesive region 41 as an bonding part between the substrate 3 and the support layer 2. As a result, a trigger for separating the adhesive layer 1 laminated on the support layer 2 from the reticle chuck C is generated (refer to arrow Q in FIG. 3(A)).

The adhesive layer 1 is formed in a size equal to or larger than the chuck region of the retile chuck C, and the adhesive region 41 is provided at a circumferential portion of the partial adhesive layer 4. Thus, the weight of the substrate 3 is applied via the adhesive region 41 mostly to the outermost part of the contact surface between the adhesive layer 1 and the reticle chuck C (refer to arrow Q). Accordingly, a large force to separate the adhesive layer 1 from the reticle chuck C acts on the outermost part of the contact surface between the adhesive layer 1 and the reticle chuck C, thereby to generate the foregoing trigger for separation.

By the generation of the trigger for separation, the separation of the adhesive layer 1 from the reticle chuck C proceeds from the outermost part toward the inside of the contact surface between the adhesive layer 1 and the reticle chuck C (refer to FIG. 3(B)). Then, when the adhesive layer 1 is completely separated from the reticle chuck C, the reticle chuck cleaner A falls onto the reticle port P having moved downward, and is received on the reticle port P. At that time, as illustrated in FIG. 3(C), the foreign matters D having dug into the adhesive layer 1 are removed from the reticle chuck C.

Figure 4:
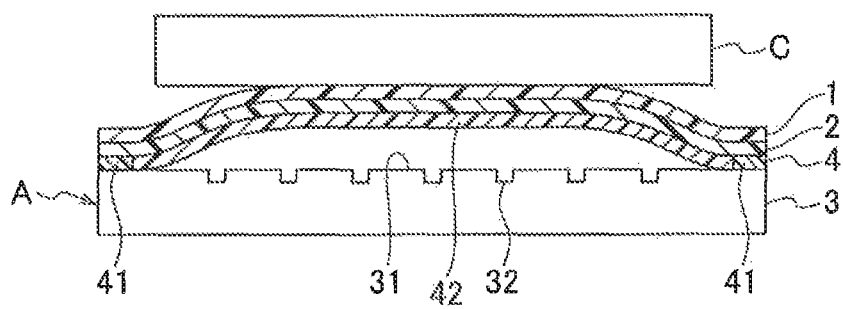
FIG. 4 is a schematic cross-sectional view of grooves 32 for increasing separation property between a substrate 3 and a partial adhesive layer 4.
Figure 4:
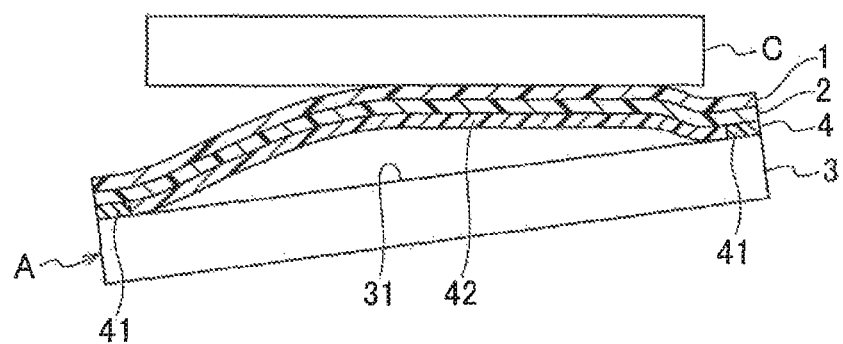
Figure 5:
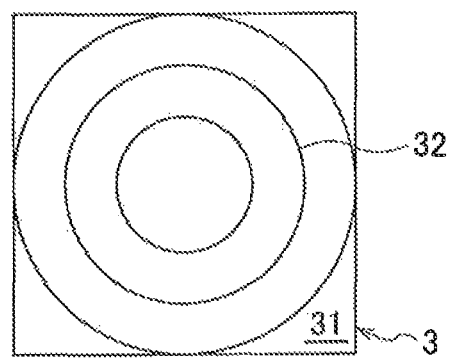
FIG. 5 is a schematic upper view of the grooves 32 for increasing separation property between the substrate 3 and the partial adhesive layer 4.
Figure 5:
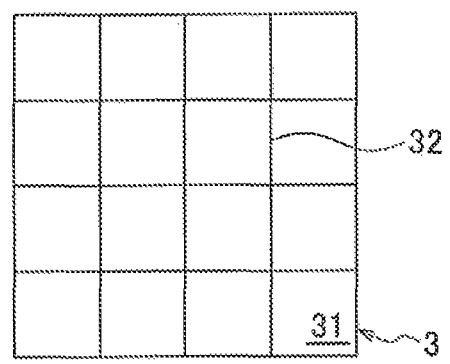

In order for the reticle chuck cleaner A separated from the reticle chuck C to fall directly onto the reticle port P located at the lower side, it is preferred to form grooves 32 on a surface 31 of the substrate 3 to increase a separation property from the non-adhesive region 42 of the contacting partial adhesive layer 4 (refer to FIGS. 4 and 5).

After the release of the reticle chuck C from the pressure of the reticle chuck cleaner A, if the non-adhesive region 42 of the partial adhesive layer 4 remains adhered to the surface 31 of the substrate 3 or is not evenly separated from the surface 31 of the substrate 3, the separation of the reticle chuck cleaner A from the reticle chuck C may proceed in the state where the reticle chuck cleaner A is inclined, as illustrated in FIG. 4(B). In this case, the reticle chuck cleaner A completely separated from the reticle chuck C may not fall straightly underneath and thus may not be received properly at the reticle port P.

By forming a plurality of concentric grooves 32 (refer to FIG. 5(A)) or a plurality of grid-like grooves 32 (refer to FIG. 5(B)) on the surface 31 of the substrate 3, it is possible to separate evenly the substrate 3 and the partial adhesive layer 4 after the release of the reticle chuck C from the pressure of the reticle chuck cleaner A. As a result, the reticle chuck cleaner A separates horizontally from the reticle chuck C and falls directly onto the reticle port P.

The grooves 32 can be formed on the surface 31 of the substrate 3 by the same method as that for fabricating a Levenson mask. Specifically, a resist is applied to a chrome membrane formed on the substrate 3, and then a pattern for the grooves 32 is printed by an electron-beam printing apparatus and subjected to a development process, thereby forming a resist pattern. Then, the chrome membrane is selectively etched by a dry etching method with the resist pattern as an etching mask. Finally, the quartz substrate is selectively etched by a dry etching method with the chrome pattern as an etching mask, and the resist is removed by cleaning to form the grooves 32. The shape of the grooves 32 is not limited to the concentric shape or the grid-like shape illustrated in the drawings but can be arbitrarily formed in a centrosymmetic pattern.

The process for increasing the separation property between the surface 31 of the substrate 3 and the non-adhesive region 42 of the partial adhesive layer 4 is not limited by a method by which to form asperities such as the foregoing grooves 32 but may use a method by which to roughen the surface 31 or a method by which to apply a separation agent to one or both surfaces of the substrate 3 and the partial adhesive layer 4.

The process of forming asperities on the surface 31 of the substrate 3 can be performed by printing or the like, for example. The separating agent may be fluorine resin or the like, for example.

In the case where the partial adhesive layer 4 is configured to have only the adhesive region 41 formed by an adhesive or a double-faced tape such that the non-adhesive region 42 is not provided, the support layer 2 contacts directly the surface 31 of the substrate 3. In this case, the foregoing process can be performed to increase the separation property between the support layer 2 and the substrate 3.

As described above, the use of the reticle chuck cleaner A makes it possible to clean the reticle chuck C only by letting the adhesive layer 1 adhere to the reticle chuck C and then removing the adhesive layer 1, without leaking the vacuum in the vacuum chamber of the EUV exposure apparatus. Accordingly, unlike a conventional method by which to return the vacuum chamber once to the atmospheric pressure and then remove the reticle chuck from the vacuum chamber for cleaning, there is no need to stop the apparatus for a long time, which makes it possible to significantly improve the operating ratio of the apparatus and increase the efficiency of manufacturing semiconductor devices.

Further, the reticle chuck cleaner A is separated from the reticle chuck C under the weight of the substrate 3, which prevents that the reticle chuck cleaner cannot be separated or detached from the reticle chuck.

The reticle chuck may be repeatedly cleaned by performing the separation step again using the reticle chuck cleaner A received on the reticle port P at the separation step. The adhesion step and the separation step are preferably repeated until the foreign matters D are fully removed from the reticle chuck C. After the completion of the cleaning, the reticle chuck cleaner A is returned to the outside of the chamber by the reticle port P.

Figure 6:
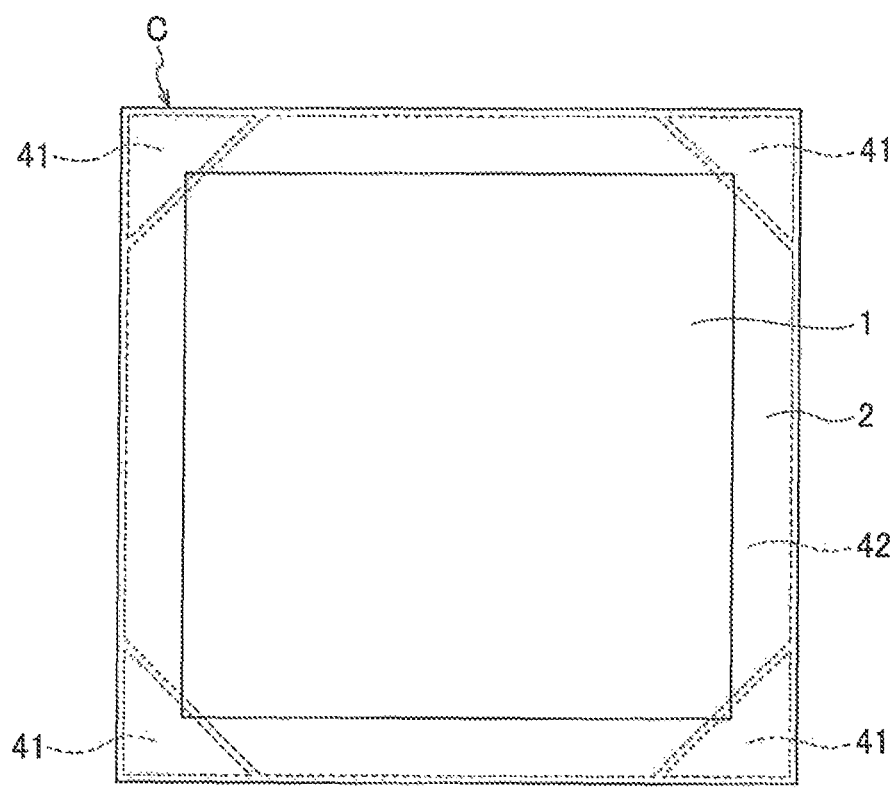
FIG. 6 is a schematic upper view of a configuration of an adhesive region 41 of a reticle chuck cleaner according to a modification example of the first embodiment.

At the reticle chuck cleaner according to the first embodiment described above, the adhesive region 41 is provided at the circumferential portion of the partial adhesive layer 4. However, the adhesive region 41 can be provided at an arbitrary portion of the partial adhesive layer 4 as far as the adhesive region 41 allows the support layer 2 and the substrate 3 to partially bond or adhere to each other and applies the weight of the substrate 3 mostly to a part of the contact surface between the adhesive layer 1 and the reticle chuck C, thereby to generate a trigger for separating the adhesive layer 1 from the reticle chuck C. For example, the adhesive region 41 may be provided at four corners of the partial adhesive layer 4, as illustrated in FIG. 6.

Figure 7:
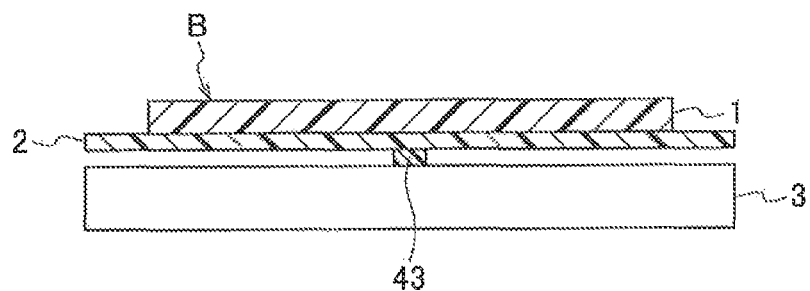
FIG. 7 is a diagram for describing a configuration of a reticle chuck cleaner B according to a second embodiment of the present invention.
Figure 7:
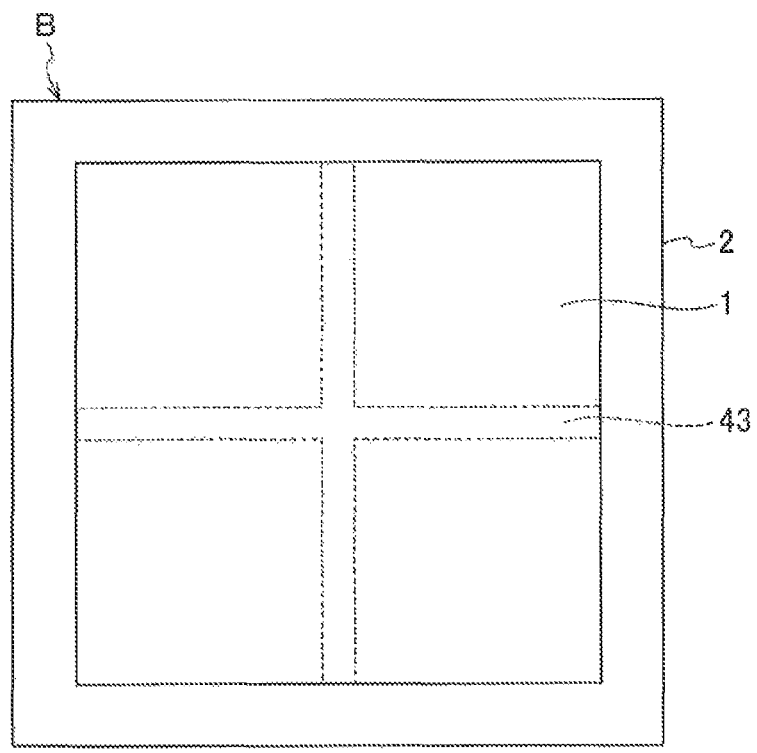

2. Reticle chuck cleaner and reticle chuck cleaning method using the same according to a second embodiment (1) Reticle Chuck Cleaner FIG. 7 is a schematic view for describing a configuration of a reticle chuck cleaner according to the second embodiment of the present invention. FIG. 7(A) is a cross-sectional view and FIG. 7(B) is an upper view. A reticle chuck cleaner shown with reference code B includes an adhesive layer 1 adhered to a chuck region of a reticle chuck in an EUV exposure apparatus, a support layer 2 laminated on the adhesive layer 1, and a substrate 3 having a shape capable of being carried to the reticle chuck.

The reticle chuck cleaner B is different from the reticle chuck cleaner A according to the first embodiment, in that the partial adhesive layer 4 allowing the support layer 2 and the substrate 3 to partially adhere or bond to each other (refer to FIG. 1) is not provided but the support layer 2 and the substrate 3 are bonded together by a double-faced tape 43. The double-faced tape 43 is inserted into between the support layer 2 and the substrate 3 so as to form a cross shape passing through the center of the two components in an upper view.

The configurations of the adhesive layer 1, the support layer 2, and the substrate 3 in the reticle chuck cleaner B are the same as those in the reticle chuck cleaner A, and thus descriptions thereof are omitted. A reticle chuck cleaning method using the reticle chuck cleaner B will be described below.

(2) Reticle Chuck Cleaning Method

Figure 8:
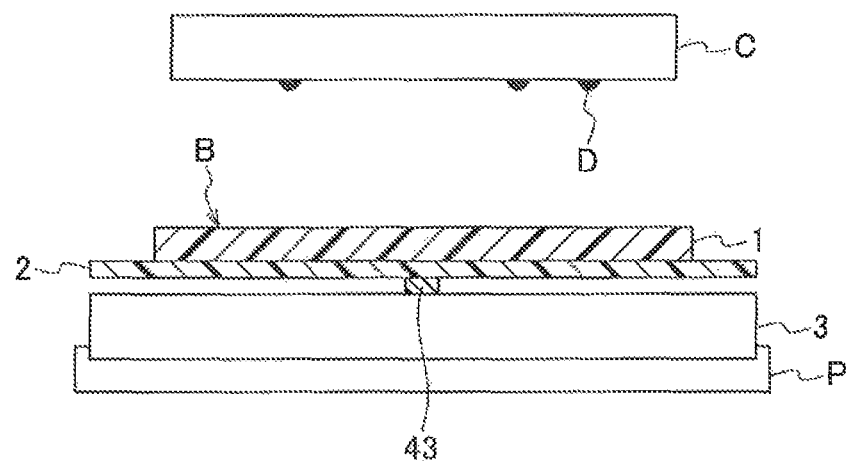
FIG. 8 is a diagram for describing an adhesion step in a reticle chuck cleaning method using the reticle chuck cleaner B.
Figure 8:
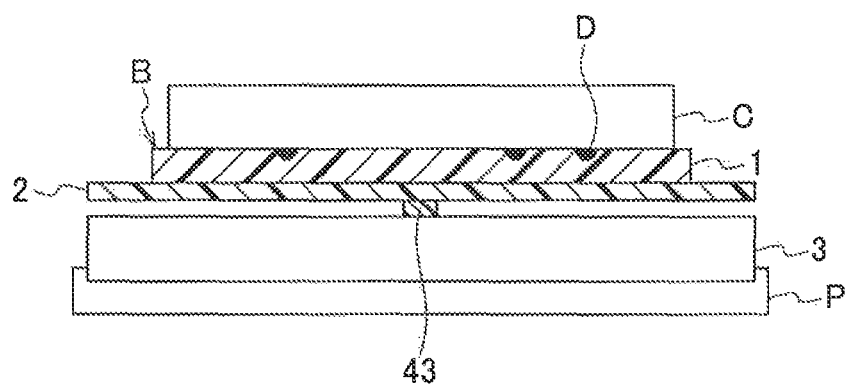
Figure 9:
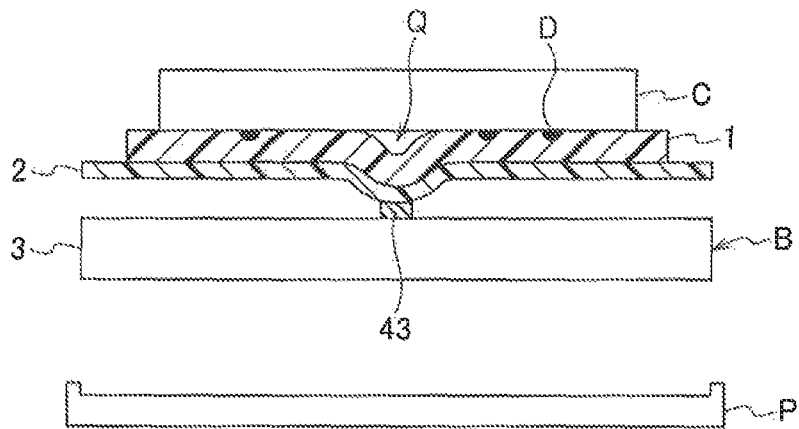
FIG. 9 is a diagram for describing a separation step in the reticle chuck cleaning method using the reticle chuck cleaner B.
Figure 9:
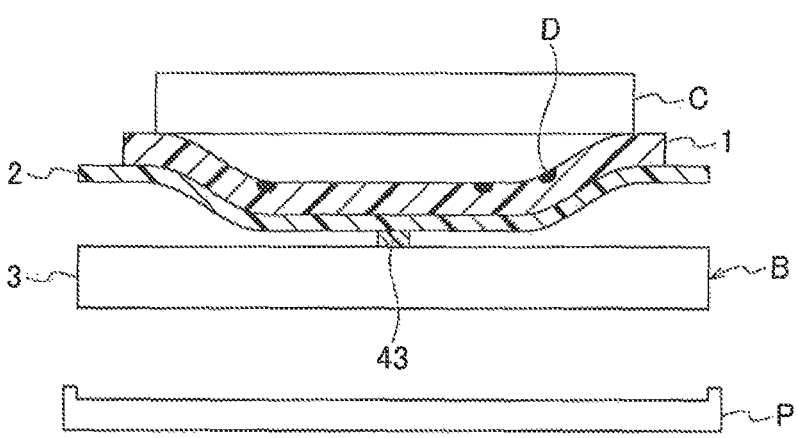
Figure 9:
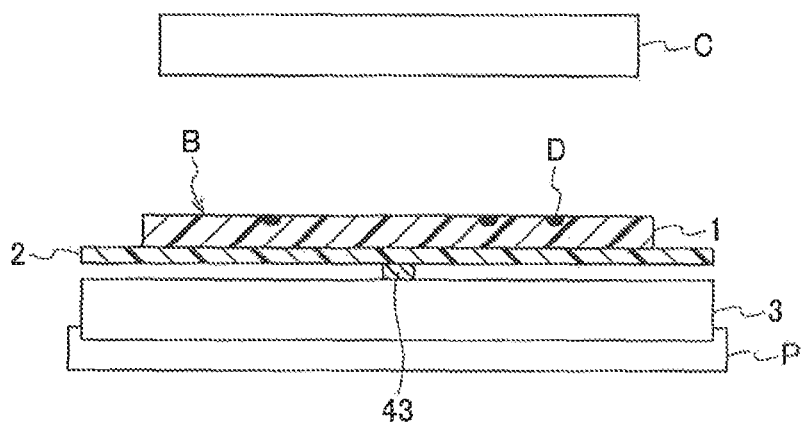

FIG. 8 is a schematic cross-sectional view for describing an adhesion step of the reticle chuck cleaning method. FIG. 9 is a schematic cross-sectional view for describing a separation step of the same.

[Adhesion Step]

At the adhesion step that is the same as that of the reticle chuck cleaning method using the reticle chuck cleaner A according to the first embodiment, first, the reticle chuck cleaner B is placed on a reticle port P of an EUV exposure apparatus. Then, the reticle chuck cleaner B is carried to the evacuated chamber of the EUV exposure apparatus as in the same manner as the normal reticle carrying (refer to FIG. 8(A)).

Next, as in the case of a general reticle chuck, the reticle port P is brought close to a reticle chuck C and the reticle chuck cleaner B is pressed from below against the reticle chuck C to let the adhesive layer 1 adhere to the reticle chuck C. At that time, foreign matters D on the reticle chuck C attach to the adhesive layer 1 and then dig into the adhesive layer 1 (refer to FIG. 8(B)).

[Separation Step]

At the separation step, first, the reticle port P is separated from the reticle chuck C to release the reticle chuck C from the pressure of the reticle chuck cleaner B. Accordingly, the substrate 3 of the reticle chuck cleaner B no longer supported by the reticle port P pulls downward the support layer 2 under its own weight via the double-faced tape 43 as an bonding part between the substrate 3 and the support layer 2. As a result, a trigger for separating the adhesive layer 1 laminated on the support layer 2 from the reticle chuck C is generated (refer to arrow Q in FIG. 9(A)).

Since the double-faced tape 43 allows the support layer 2 and the substrate 3 to adhere to each other only at the center, the weight of the substrate 3 via the double-faced tape 43 is applied mostly to the central part of the contact surface between the adhesive layer 1 and the reticle chuck C (refer to arrow Q). Accordingly a large force acts on the central part of the contact surface between the adhesive layer 1 and the reticle chuck C to separate the adhesive layer 1 from the reticle chuck C, thereby generating the foregoing trigger for separation.

By the generation of the trigger for separation, the separation of the adhesive layer 1 from the reticle chuck C proceeds from the central part toward the outside of the contact surface between the adhesive layer 1 and the reticle chuck C (refer to FIG. 9(B)). Then, when the adhesive layer 1 is completely separated from the reticle chuck C, the reticle chuck cleaner B falls onto the reticle port P having moved downward, and is received on the reticle port P. At that time, as illustrated in FIG. 9(C), the foreign matters D having dug into the adhesive layer 1 are removed from the reticle chuck C.

In order for the reticle chuck cleaner B separated from the reticle chuck C to fall directly onto the reticle port P located at the lower side, it is preferred to process a surface 31 of the substrate 3 to increase a separation property from the contacting support layer 2. This process can be performed by the same method as that for the reticle chuck cleaner A.

As described above, the use of the reticle chuck cleaner B makes it possible to clean the reticle chuck C only by letting the adhesive layer 1 adhere to the reticle chuck C and then removing the adhesive layer 1, without leaking the vacuum in the vacuum chamber of the EUV exposure apparatus. Accordingly, unlike a conventional method by which to return the vacuum chamber once to the atmospheric pressure and then remove the reticle chuck from the vacuum chamber for cleaning, there is no need to stop the apparatus for a long time, which makes it possible to significantly improve the operating ratio of the apparatus and increase the efficiency of manufacturing semiconductor devices.

Further, the reticle chuck cleaner B is separated from the reticle chuck C under the weight of the substrate 3, which prevents that the reticle chuck cleaner cannot be separated or detached from the reticle chuck.

As described in relation to the reticle chuck cleaner A, the reticle chuck may be repeatedly cleaned by performing the separation step again using the reticle chuck cleaner B received on the reticle port P at the separation step.

As described above, the double-faced tape 43 can be provided at an arbitrary portion as far as the double-faced tape 43 allows the support layer 2 and the substrate 3 to partially bond or adhere to each other and applies the weight of the substrate 3 mostly to a part of the contact surface between the adhesive layer 1 and the reticle chuck C, thereby to generate a trigger for separating the adhesive layer 1 from the reticle chuck C.

REFERENCE SIGNS LIST

A, B: Reticle chuck cleaner
C: Reticle chuck
D: Foreign matter
1: Adhesive layer
2: Support layer
3: Substrate
31: Substrate surface
32: Groove
4: Partial adhesive layer
41: Adhesive region
42: Non-adhesive region
43: Double-faced tape

The invention claimed is:

1. A reticle chuck cleaner for cleaning a reticle chuck of an apparatus, comprising:
   an adhesive layer to be adhered to a chuck region of the reticle chuck;
   a support layer on the adhesive layer; and
   a substrate having a shape capable of being carried to the reticle chuck,
   a partial adhesive layer having an adhesive region and a non-adhesive region, the partial adhesive layer provided between the support layer and the substrate,
   wherein the support layer and the substrate are partially bonded by the partial adhesive layer.

2. The reticle chuck cleaner according to claim 1, wherein a bonding part between the support layer and the substrate is provided such that, when the support layer is pulled at the bonding part, a trigger for separating the adhesive layer from the reticle chuck is generated.

3. The reticle chuck cleaner according to claim 2, wherein the trigger for separation is generated by the substrate pulling the support layer under a weight thereof via the bonding part.

4. The reticle chuck cleaner according to claim 3, wherein the generated trigger for separation acts as a starting point of separation of the adhesive layer from the reticle chuck.

5. The reticle chuck cleaner according to claim 1, wherein the partial adhesive layer is a light-curable adhesive layer, and
a light-cured region of the light-curable adhesive layer constitutes a nonbonding part between the support layer and the substrate, and the remaining region of the light-curable adhesive layer constitutes the bonding part.

6. The reticle chuck cleaner according to claim 1, wherein the non-bonding part between the support layer and the substrate is processed to increase separation property between the support layer and the substrate in contact with each other, or separation property between the partial adhesive layer and the substrate in contact with each other.

7. The reticle chuck cleaner according to claim 1, wherein the process include formation of asperities on the surface of the substrate or roughening of the surface of the substrate.

8. The reticle chuck cleaner according to claim 1, wherein the adhesive layer is formed by an adhesive including (meth)acrylic acid ester polymer.

9. The reticle chuck cleaner according to claim 1, wherein the substrate is a photomask blanks.

10. The reticle chuck cleaner according to claim 9, wherein the photo mask blanks is formed by glass, quartz, or synthetic quartz.

11. The reticle chuck cleaner according to claim 1, wherein the non-adhesive region is at a circumferential portion of the adhesive region.

12. The reticle chuck cleaner according to claim 1, wherein a partial adhesive layer having a first surface on the support layer and a second surface on the substrate, the first surface being an opposite surface of the second surface.

* * * * *